(12) United States Patent
Elzinga

(10) Patent No.: US 11,495,382 B2
(45) Date of Patent: Nov. 8, 2022

(54) HIGH Q-FACTOR INDUCTOR

(71) Applicant: Intel Corporation, Santa Clara, CA (US)

(72) Inventor: Mark Elzinga, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 703 days.

(21) Appl. No.: 16/252,618

(22) Filed: Jan. 19, 2019

(65) Prior Publication Data

US 2020/0234864 A1    Jul. 23, 2020

(51) Int. Cl.
| | |
|---|---|
| *H01F 17/00* | (2006.01) |
| *H03L 7/093* | (2006.01) |
| *H03L 7/099* | (2006.01) |
| *H01F 41/04* | (2006.01) |
| *H03B 5/08* | (2006.01) |

(52) U.S. Cl.
CPC ....... *H01F 17/0013* (2013.01); *H01F 41/041* (2013.01); *H03B 5/08* (2013.01); *H03L 7/093* (2013.01); *H03L 7/099* (2013.01); *H03B 2200/004* (2013.01); *H03B 2201/0208* (2013.01)

(58) Field of Classification Search
CPC .................................................. H01F 17/0013
USPC ............................................................ 331/167
See application file for complete search history.

(56) References Cited

U.S. PATENT DOCUMENTS

| | | | | |
|---|---|---|---|---|
| 2005/0046501 A1* | 3/2005 | Moore | ................. | H03B 5/1253 331/117 FE |
| 2010/0109724 A1* | 5/2010 | Huang | ................. | H03B 5/1215 327/156 |
| 2010/0225407 A1* | 9/2010 | Goyal | ................... | H03B 19/00 331/117 FE |

\* cited by examiner

*Primary Examiner* — Joseph Chang
(74) *Attorney, Agent, or Firm* — Essential Patents Group, LLP

(57) ABSTRACT

Described is a high Q-factor inductor. The inductor is formed as a unit cell coil, which is copied twice for a dual-coil inductor and copied four times for a quad-coil inductor. For each copy of the unit cell coil, the coil is rotated a subsequent substantially 90 degrees or substantially −90 degrees. The rotation enables the terminals of the inductor to be routed equal-distant to a circuit that is placed in the line of symmetry between the two coils.

20 Claims, 12 Drawing Sheets

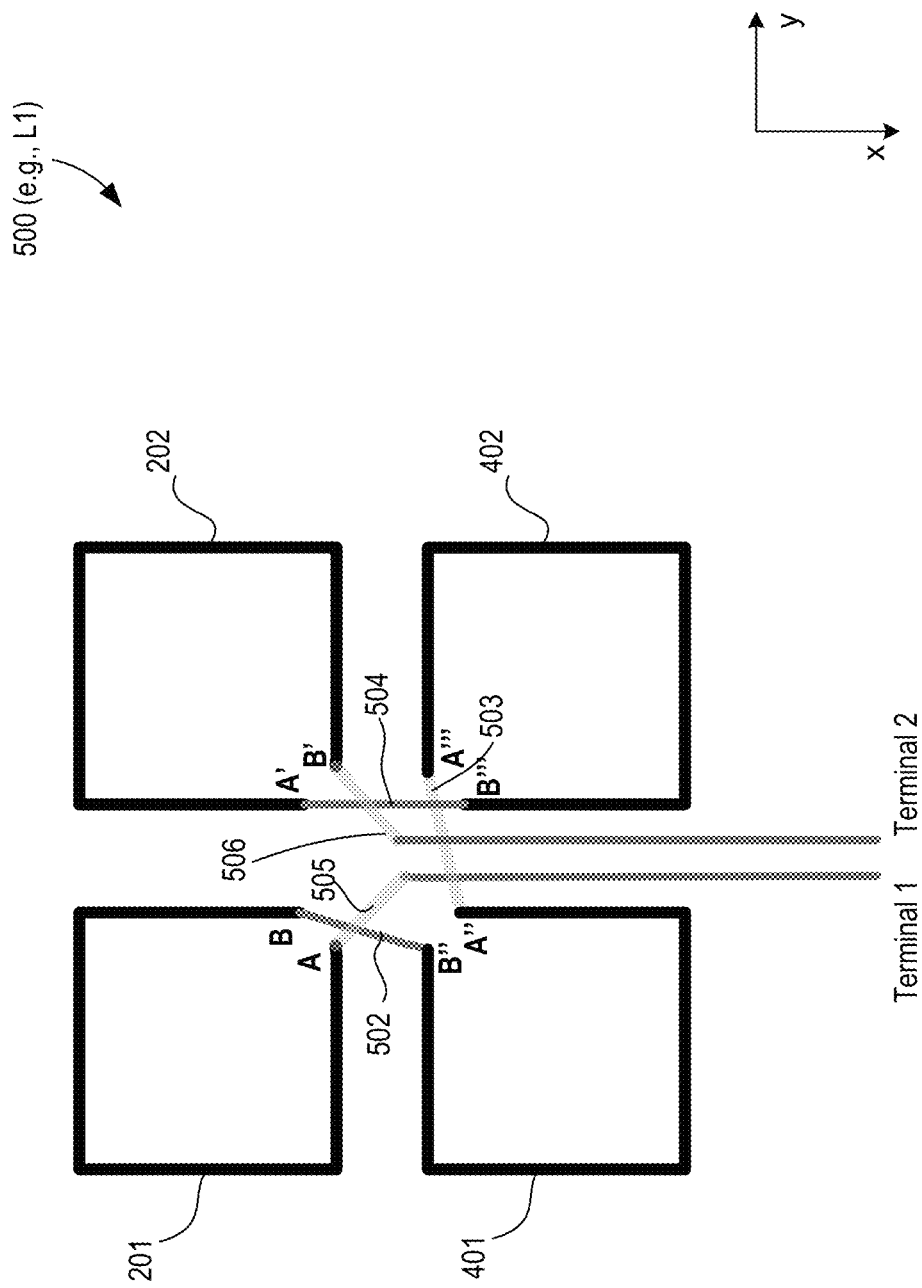

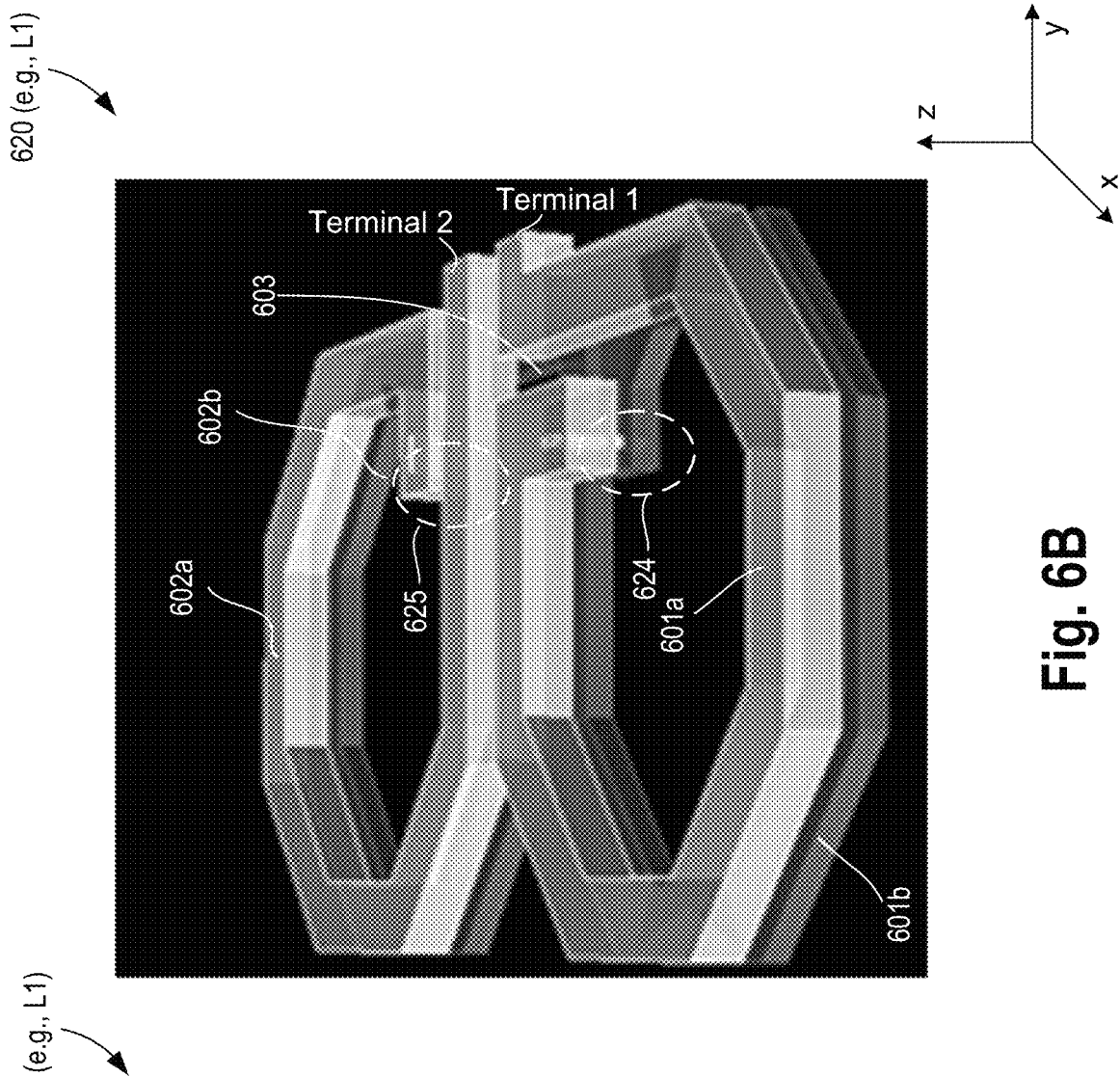
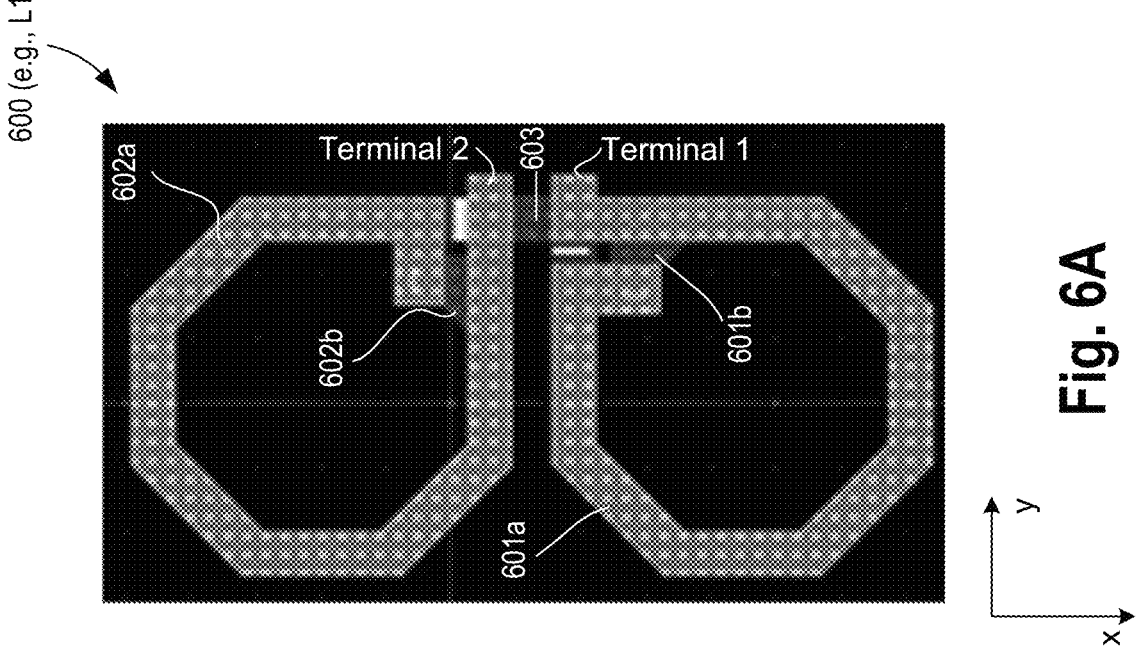
Fig. 6B
Fig. 6A

HIGH Q-FACTOR INDUCTOR

BACKGROUND

In processors, modems, and other computing products, the designs rely on low jitter on-die frequency synthesis using phase locked loops (PLLs) or other clock generators. In high performance wireline or wireless I/Os, the clock generators are based on LC (inductor-capacitor) oscillators with a low cost reference clock solution to achieve good jitter or phase noise performance with low cost. To avoid having to rely on a dedicated and expensive off-chip "clean clock" generator, the LC oscillators are desired to have low bandwidth to filter the incoming noise floor and deterministic jitter of the integrated crystal oscillator system that includes routing susceptible to cross-talk effects that induced jitter, which puts more burden on the LC oscillator in order to obtain sufficiently low jitter.

In all of these applications, the LC oscillators are susceptible to magnetic coupling from adjacent noise sources such as routing, inductors, power grid, stacked die structures, and magnetic structures for voltage regulators. These noise sources could be on-die or on-package. The coupling can cause fatal timing and jitter failures in many cases.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 5 illustrates a top view of the quad-coil inductor with substantially 90 degree rotated independent coils, in accordance with some embodiments.

FIGS. 6A-B illustrate a top view and corresponding 3D view, respectively, of a multi-tier octagonal-like inductor with substantially 90 degree rotated independent coils, in accordance with some embodiments.

DETAILED DESCRIPTION

Figure 1:
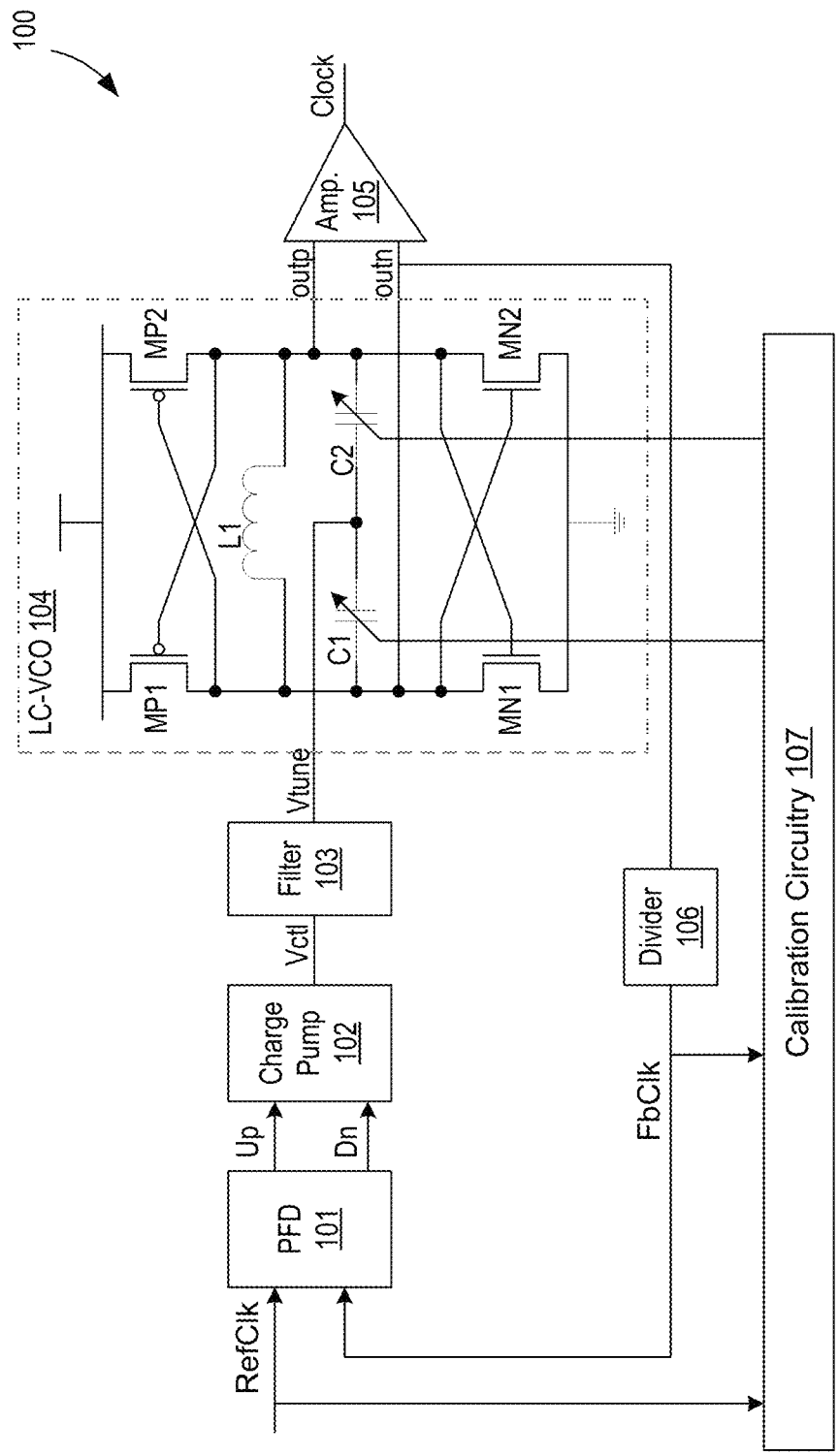
FIG. 1 illustrates a phase locked loop (PLL) with an LC-oscillator having a high-Q inductor, in accordance with some embodiments.

Quality factor (Q-factor) of an inductor is a measure of its performance Q-factor is a scalar quantity that indicates efficiency of an inductor described as a ratio of inductive reactance to its resistance at a given frequency. High-Q inductors are desirable for narrow bandwidth LC PLLs. Traditional two-terminal 8-shape and non 8-shape symmetric inductors interweave 'p' and 'n' nodes (also referred to as terminal-1 and terminal-2, respectively) end up having reduced Q-factor due to multiple metal layer transitions and associated vias, which also increase overall area. The relative impact to Q-factor from layer transitions is a function of the number of turns or windings used in the coil. As the turns increase, the number of vias and layer transitions will increase which further degrade the Q-factor. Similarly, designs that utilize multiple layers in series, otherwise known as stacked turns, run into the same issue of the vias and layer transitions, but with two other drawbacks. First, they require additional metal layers, or larger area and additional layer transitions and vias. Second, the stacked layers increase capacitance between the "p" and "n" nodes, which is not a desirable outcome since this increases capacitance through a Miller coupling effect when the p and n nodes are differential signals. Further, multi-pole implementations such as a traditional 8-shape or other implementations of far field cancelling coils that do not interweave 'p' and 'n' nodes, but instead have independent coils providing the 'p' and 'n' nodes have inherent mismatch in their inductance values. Such implementations have reduced Q-factor due to extra jogs in the routing between the circuit and the inductor when the coils are required to be designed with two inputs for the 'p' and 'n' nodes that are extending to the circuit from the same direction since the coils must be "stepped" to meet this requirement.

Some embodiments describe a unit cell coil that is a single node which does not mix 'p' and 'n' nodes. The unit cell coil is copied twice for a dual-coil and copied four times for a quad-coil. For each copy, the coil is rotated a subsequent 90 degrees (or substantially 90 degrees) or −90 degrees (or substantially −90 degrees). The rotation enables the terminals of the inductor to be routed substantially equal-distant to a circuit that is placed in the line of symmetry between the two coils. Without this rotation, the extra routing has some jogging that will add a significant mismatch in the 'p' versus 'n' coil inductance since one of the coils will have a jog that is coupling with negative mutual inductance to the coil and the other of the coils will have positive mutual inductance coupled from the jog to the coil.

There are many technical effects of the various embodiments. For example, the 90 degree rotation (or substantially 90 degree rotation) geometry results in as much as 50% higher Q-factor than the traditional non 8-shape inductor, and as much as 15% Q-factor improvement compared to other 8-shape inductors. The 90 degree rotation (or substantially 90 degree rotation) geometry results in better matching between 'p' and 'n' coil inductance values compared to a "stepped" implementation of an 8-shape coil, and as much as 50% smaller area than a two-turn traditional 8-shape inductor by utilizing layer stacking and 90% smaller area than a single turn traditional 8-shape inductor. The magnitude of the Q-factor improvement is also dependent on the process technology characteristics such as the resistivity of the silicon substrate. The inductor of various embodiments is able to achieve higher Q-factor (e.g., greater than 12.5 on a typical on low resistance silicon substrate process, and Q-factor higher than 16.6 in a very compact area on high resistance substrate) due to its unique characteristics than alternative structures on the same process technology for the same area. The smaller inductor area is enabled since the geometry minimizes the metal layer transitions and thus enables multiple turns, as well as layer stacking for a combination of turns in top metal and top metal minus one, as well as other additional metal layers if they are available. Other technical effects will be evident from the various embodiments and figures. While the following embodiment illustrate various configurations of an inductor for use in an LCPLL (inductor-capacitor phase locked loop), the inductor usage is not limited to an LCPLL. For example, the inductor can be used in a voltage regulator, filter, and other circuitries.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device.

The term "between" may be employed in the context of the z-axis, x-axis or y-axis of a device. A device that is between two other devices may be directly connected to one or both of those devices, or it may be separated from both of the other two devices by one or more intervening devices.

Here, the term "backend" or back end of line (BOEL) generally refers to a section of a die which is opposite of a "frontend" or front end of line (FEOL) and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a phase locked loop (PLL) 100 with an LC-oscillator having a high-Q inductor, in accordance with some embodiments. PLL 100 comprises phase frequency detector 101, charge pump 102, filter 103, LC-oscillator 104, clock buffer or amplifier (Amp.) 105, divider 106, and calibration circuitry 107.

The phase detector 101 receives a reference clock (RefClk) and a feedback clock (FbClk) and generates Up and Down (Dn) signals that are pulses that represent the relative phase different between the RefClk and the FbClk. In some embodiments, phase detector 101 may be a phase detector only or a phase frequency detector (PFD). Some implementations of phase detector 101 use analogue techniques, while others use digital circuitry. The phase detector 101 can be designed to be sensitive to just phase or sensitive to frequency and to phase. When phase detectors are only sensitive to phase of RefClk and FbClk, they produce an output that is proportional to the phase difference between the two signals. When the phase difference between the RefClk and FbClk is steady, phase detector 101 produces a constant voltage. When there is a frequency difference between the two signals, phase detector 101 produces a varying voltage. Example implementations of phase detectors 101 include diode ring phase detector, exclusive OR phased phase detector, JK flip-flop based comparators, and dual D-type phase detectors. Generally, when a digital phase detector is to implement phase detector 101, short Up and Dn pulses are created by the logic gates of the digital phase detector.

Charge pump 102 receives the Up and Dn pulses and sources or sinks current on node Vctl. The signal on Vctl is then filtered by low pass filter (LPF) 103 to generate a filtered control voltage Vtune. Vtune is then used to control the oscillating frequency of LC-VCO (voltage controlled oscillator) 104. The output of VCO 104 is a differential clock outp and outn, one of which is then divided in frequency by Divider 106 to generate FbClk. During PLL lock, Up and Dn signals provide evidence of dynamic phase error. Dynamic phase error is the phase error between RefClk and FbClk before PLL is declared locked. A PLL is declared locked when the phase difference between RefClk and FbClk is below a threshold (programmable or predetermined).

In some embodiments, filter 103 is a low pass filter (LPF) comprising one or more resistors and one or more capacitors. The resistors and capacitors can be formed as transistors or special devices. For example, the capacitor can be formed of a metal mesh only, transistors only, or a combination of both. In some embodiments, the one or more resistors are implemented as transistors operating in linear region, special resistive devices offered by a process technology node, or a combination of transistors and special devices.

In some embodiments, LC VCO 104 comprises p-type transistors MP1, MP2; n-type transistors MN1, and MN2, vacractor comprising capacitors C1 and C2, and inductor L1. In some embodiments, the capacitors have adjustable capacitance. The oscillating frequency of LC-VCO 104 depends on the capacitance of capacitors C1, and C2, the inductance of inductor L1, and the bias voltage Vtune. In some embodiments, the coarse frequency setting of LC-VCO 104 is achieved by calibration circuitry 107 that compares the phase different between RefClk and FbClk to set a lockable frequency of LC-VCO 104. LC-VCO 104 is then tuned using Vtune (e.g., fine tuning) to achieve the desired frequency that results in a locked PLL.

In various embodiments, inductor L1 comprises a unit cell coil that is a single node which does not mix 'p' and 'n' nodes. The unit cell coil is copied twice for a dual-coil and copied four times for a quad-coil. For each copy, the coil is rotated a subsequent 90 degrees (or substantially 90 degrees) or −90 degrees (or substantially −90 degrees). The rotation enables the terminals (e.g., outp and outn) of the inductor to be routed substantially equal-distant to transistors MP1, MP2, MN1, MN2, and terminals of capacitors C1 and C2 are then placed in the line of symmetry between the two coils. Without this rotation, the extra routing has some jogging that will add a significant mismatch in the 'p' versus 'n' coil inductance since one of the coils will have a jog that is coupling with negative mutual inductance to the coil and the other will have positive mutual inductance coupled from the jog to the coil.

The higher-Q of inductor L1, compared to traditional 8-shape inductor coils, is enabled by the geometry of the unit cell coils. For example, the geometry reduces the number of metal layer transitions between "Top Metal", and "Top Metal Minus One Layer" compared to the interwoven traditional 8-shape structures. The higher-Q of inductor L1 is also enabled by reduced metal layer transitions within the unit cell coils having stacked layers compared to stacked coils in traditional inductors. The stacking of the layers of coils boots the Q-factor by providing an inherent shielding effect that reduces the loss from displacement current to the substrate below.

Compared to a stepped geometry that has independent 'p' and 'n' coils, by performing a 90 degree rotation, the inductor geometry of various embodiments avoids destructive mutual inductance from the jogs in the routing between the inductor and the circuit it connects to that are inherent in the stepped structure. As such, Q-factor increases for the inductor of various embodiments. Compared to non-8-shape or non-differential magnetic flux coils, the shape of the inductors of the various embodiments enables reduction of Eddy current loss in the substrate due to smaller coils instead of one large coil, and each coil is coupling in opposite direction that provides some cancellation of the induced Eddy current in the substrate. The inductor of the various embodiments can be fabricated on-die, off-die, on-package, within package substrate, above active devices in the BEOL (or backend), over the die substrate in the FOEL (or frontend), etc.

Figure 2:
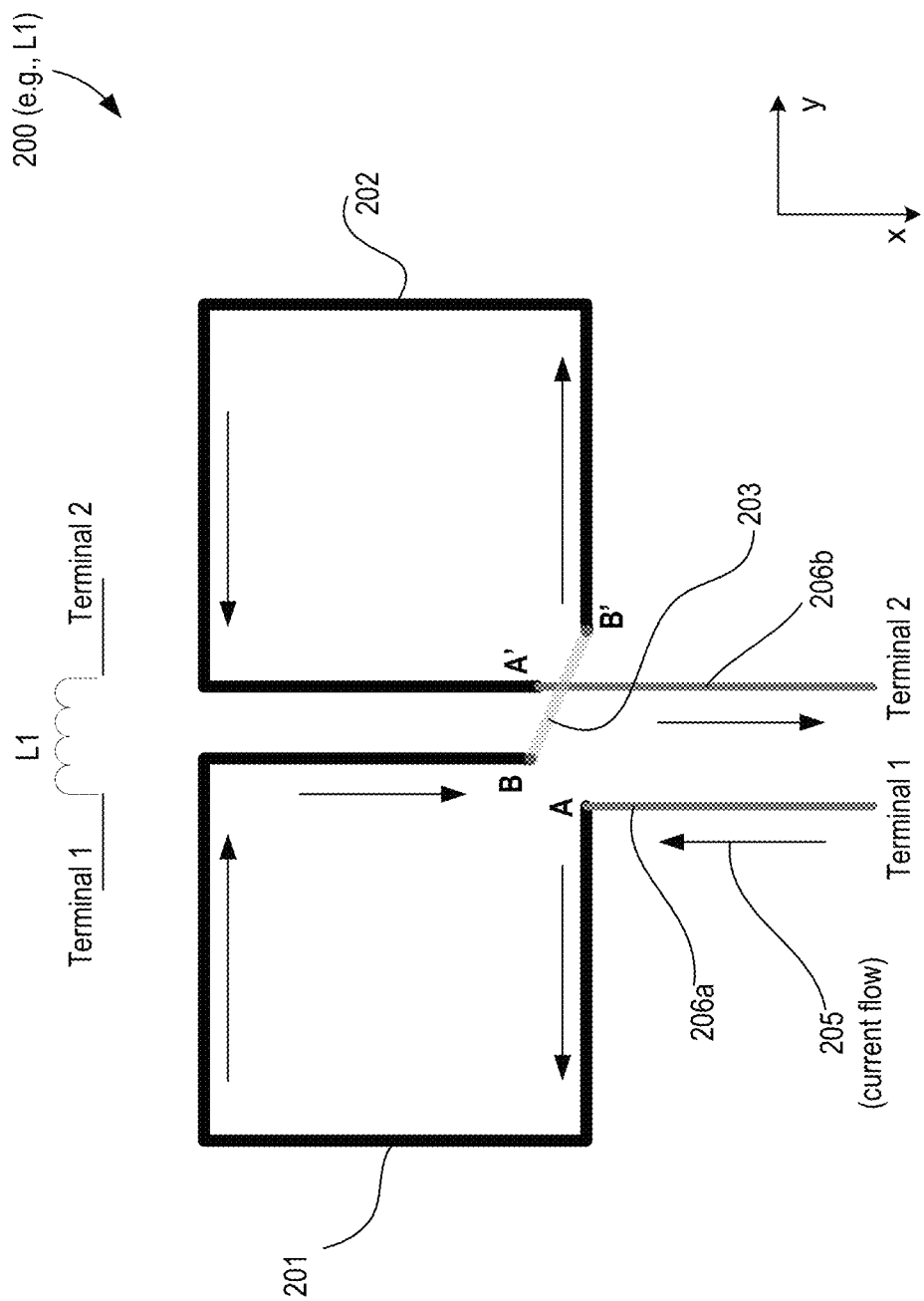
FIG. 2 illustrates a top view of a dual-coil inductor with substantially 90 degree rotated independent coils, in accordance with some embodiments.

FIG. 2 illustrates a top view of a dual-coil inductor 200 with substantially 90 degree rotated independent coils, in accordance with some embodiments. The dual-coil inductor comprises first unit cell coil 201 having two ends A and B; a second unit cell coil 202 having ends A' and B', where the second unit cell coil 202 is formed by copying the first unit cell coil 201 and rotating it by 90 degrees or substantially 90 degrees. For example, second unit cell coil 202 is formed by rotating a copy of unit cell 201 in the clockwise direction.

In some embodiments, end A of the first unit cell coil 201 is connected to a metal line that forms terminal 1 of the inductor. In some embodiments, end A' of the second unit cell coil 201 is connected to another metal line that forms terminal 2 of the inductor. In some embodiments, first and second coils 201 and 202 are coupled together via metal 203. This metal may be formed on a different layer than the metal layer for coils 201 and 202. As such, a tightly coupled dual inductor with outward facing terminals is formed. The current flow through the inductor coils is shown by flow 205. Referring to the example of FIG. 1. terminal 1 206a and terminal 2 206*b* are connected to nodes outp and outn, respectively, of LC-VCO 104. Due to a well matched geometry of dual-coil inductor 200, destructive mutual inductance is avoided which improves the Q-factor of inductor 200.

Figure 3:
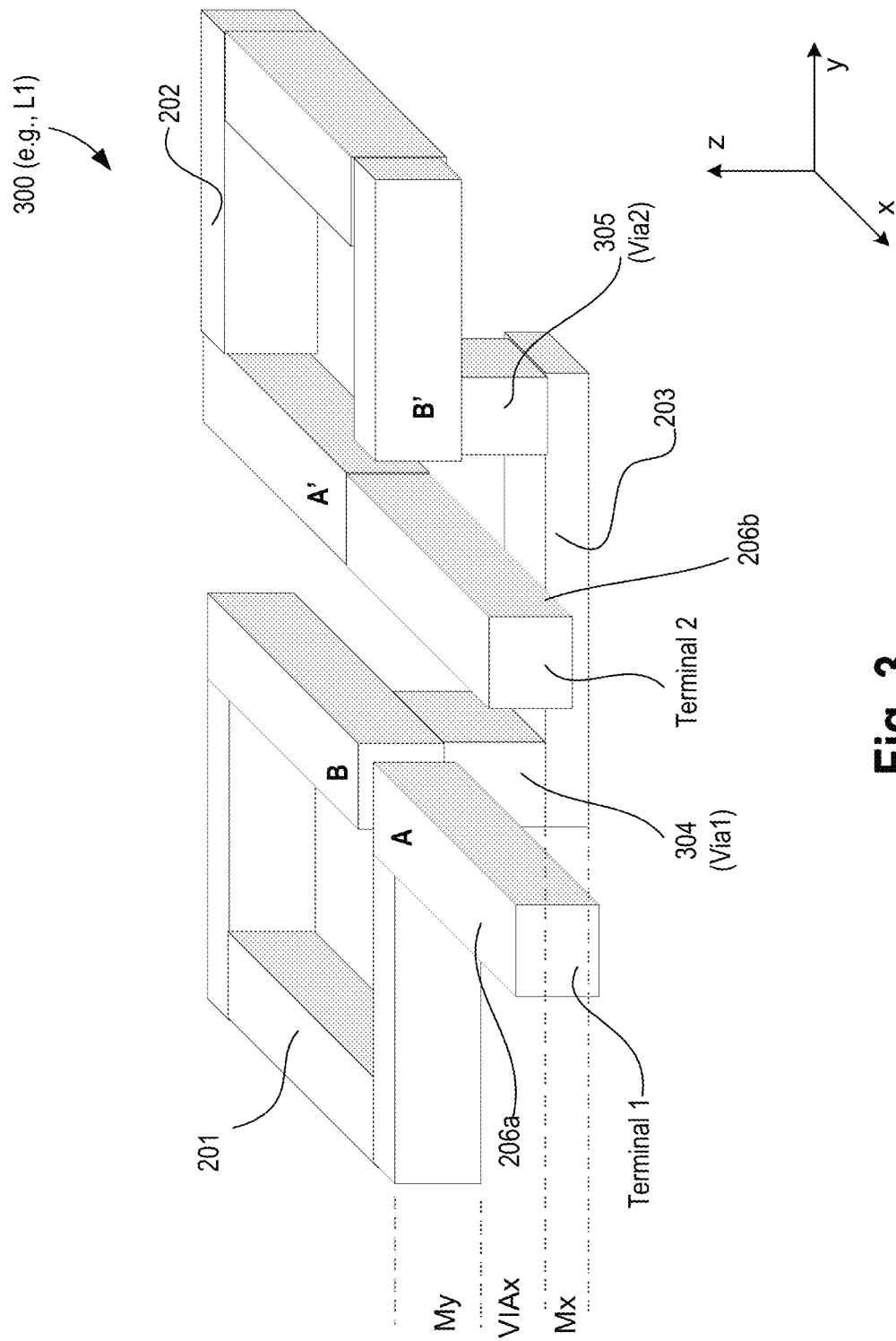
FIG. 3 illustrates a three-dimensional (3D) view of the dual-coil inductor with substantially 90 degree rotated independent coils, in accordance with some embodiments.

FIG. 3 illustrates a three-dimensional (3D) view of the dual-coil inductor 300 with substantially 90 degree rotated independent coils, in accordance with some embodiments. Compared to the top view of FIG. 2, here the vias 304, 305, and the underlying interconnect 203 are shown. Via 304 (Via1) couples the B end of first coil 201 to interconnect 203. Via 305 (Via2) couples the B' end of second coil 202 with interconnect 203. In some embodiments, the coils 201 and 202, and the interconnects for terminals 1 and 2 are formed in the same metal layer (e.g., My, where 'y' is an integer). Vias 304, 305 are formed underneath (or above) My in a separate layer VIAx for vias, where 'x' is an integer. The geometry of the two unit coils 201 and 202 coupled through vias 304, 305 and interconnect 203 decrease the number of jogs in the path of electric current. As such, the destructive magnetic flux is also reduced, which in turn increases the Q-factor.

Figure 4:
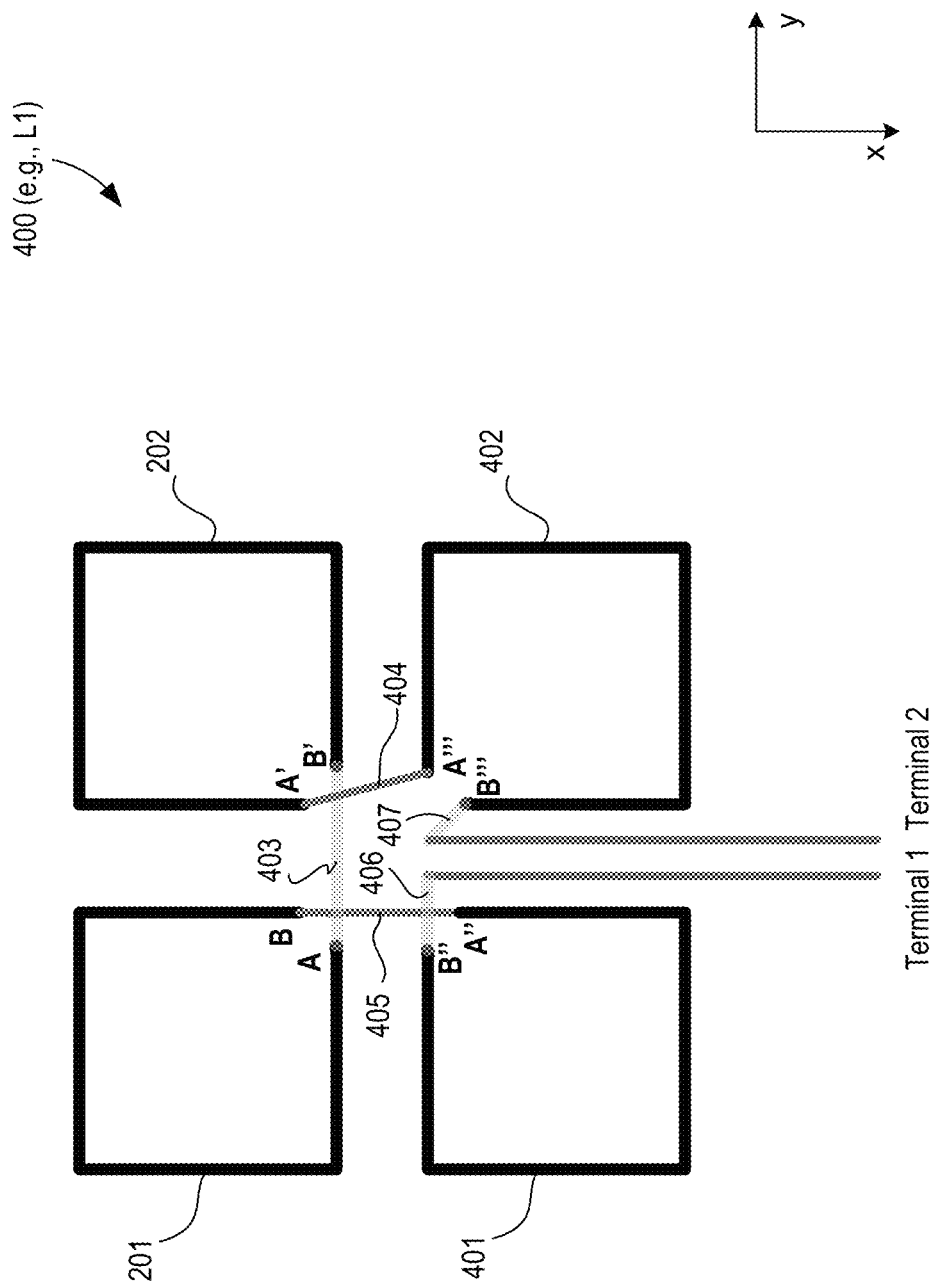
FIG. 4 illustrates a top view of the quad-coil inductor with substantially 90 degree rotated independent coils, in accordance with some embodiments.

FIG. 4 illustrates a top view of the quad-coil inductor 400 with substantially 90 degree rotated independent coils, in accordance with some embodiments. Here, four unit coils are shown. Coil 202 is a copy of coil 201 but rotated 90 degrees (or substantially 90 degrees) clockwise. Coil 401 is a copy of coil 201 but rotated 90 degrees (or substantially 90 degrees) counter clockwise. Coil 402 is a copy of coil 202 but rotated 90 degrees (or substantially 90 degrees) counter clockwise. The ends of coils 201, 202, 401, and 402 are coupled by interconnects 403, 404, and 405. In various embodiments, coils 201, 202, 401, and 402 are along a same x-y-z plane of a device.

For example, end A of coil 201 is coupled to end B' of coil 202 through interconnect 403 and associated vias (not shown in top view). In some embodiments, interconnect 403 is on different layer than coils 201 and 202. End A' of coil 202 is coupled to end A''' of coil 402 through interconnect 404 and associated vias (not shown in top view). Interconnect 404 is on different layer than coils 202 and 402, in accordance with some embodiments. In some embodiments, interconnect 404 is on a different metal layer than interconnect 403. End B of coil 201 is coupled to end A'' of coil 401 through interconnect 405 and associated vias (not shown in top view). Interconnect 405 is on different layer than coils 201 and 401, in accordance with some embodiments. In some embodiments, interconnect 405 is on a different metal layer than interconnect 403, but same layer as interconnect 404. The two terminals (Terminal 1 and Terminal 2) of the quad-coil inductor 400 are coupled to coils 401 and 402 via interconnects 406 and 407. In some embodiments, interconnects 406 and 407 are on the same metal layer as interconnect 403, but different layer than interconnect 405 and 404. In some embodiments, interconnects for Terminal 1 and Terminal 2 are on the same layer as coils 201, 202, 401, and 402.

FIG. 5 illustrates a top view of the quad-coil inductor 500 with substantially 90 degree rotated independent coils, in accordance with some embodiments. Here, four unit coils are shown which are connected differently than coils of FIG. 4. Coil 202 is a copy of coil 201 but rotated 90 degrees (or substantially 90 degrees) clockwise. End B of coil 201 is coupled to end B'' of coil 401 through interconnect 502 and associated vias (not shown in top view). Interconnect 502 is on different layer than coils 201 and 401, in accordance with some embodiments. End A'' of coil 401 is coupled to end A''' of coil 402 through interconnect 503 and associated vias (not shown in top view). Interconnect 503 is on different layer than coils 401 and 402, in accordance with some embodiments. In some embodiments, interconnect 503 is on a different metal layer than interconnect 502 and 504. End A' of coil 202 is coupled to end B'' of coil 402 through interconnect 504 and associated vias (not shown in top view). Interconnect 504 is on different layer than coils 202 and 402, in accordance with some embodiments. In some embodiments, interconnect 504 is on a different metal layer than interconnect 503.

The two terminals of the quad-coil inductor 500 are coupled to coils 201 and 202 via interconnects 505 and 506 as shown. In some embodiments, interconnects 505 and 506 are on the same metal layer as interconnect 503, but different layer than interconnect 502 and 504. In some embodiments, interconnects for terminal 1 and terminal 2 are on the same layer as coils 201, 202, 401, and 402. In various embodiments, coils 201, 202, 401, and 402 are along a same x-y-z plane of a device.

FIGS. 6A-B illustrate a top view 600 and corresponding 3D view 620, respectively, of a multi-tier octagonal-like inductor with substantially 90 degree rotated independent coils, in accordance with some embodiments. The multi-tier octagonal-like inductor comprises two lower coils and two upper coils as shown in FIG. 6A. A copy of lower coil 601*a* is rotated clockwise to form upper coil 602*a*. Another coil 601*b* of same shape as coil 601*a* is formed under coil 601*a*, and coupled to coil 601*a* through via portion 624. Coil 602*b* of same shape as coil 602*a* is formed under coil 602*a*, and coupled to coil 602*a* through via portion 625. The lower coils 601*a* and 602*b* are coupled together through interconnect 603. While FIGS. 6A-B show two tiers, more than two triers for each coil can be formed under or over each unit coil. In some embodiments, the dual-coil structure can be expanded to quad-coil structure of FIGS. 4-5 with multiple tiers using the same concepts.

Figure 7:
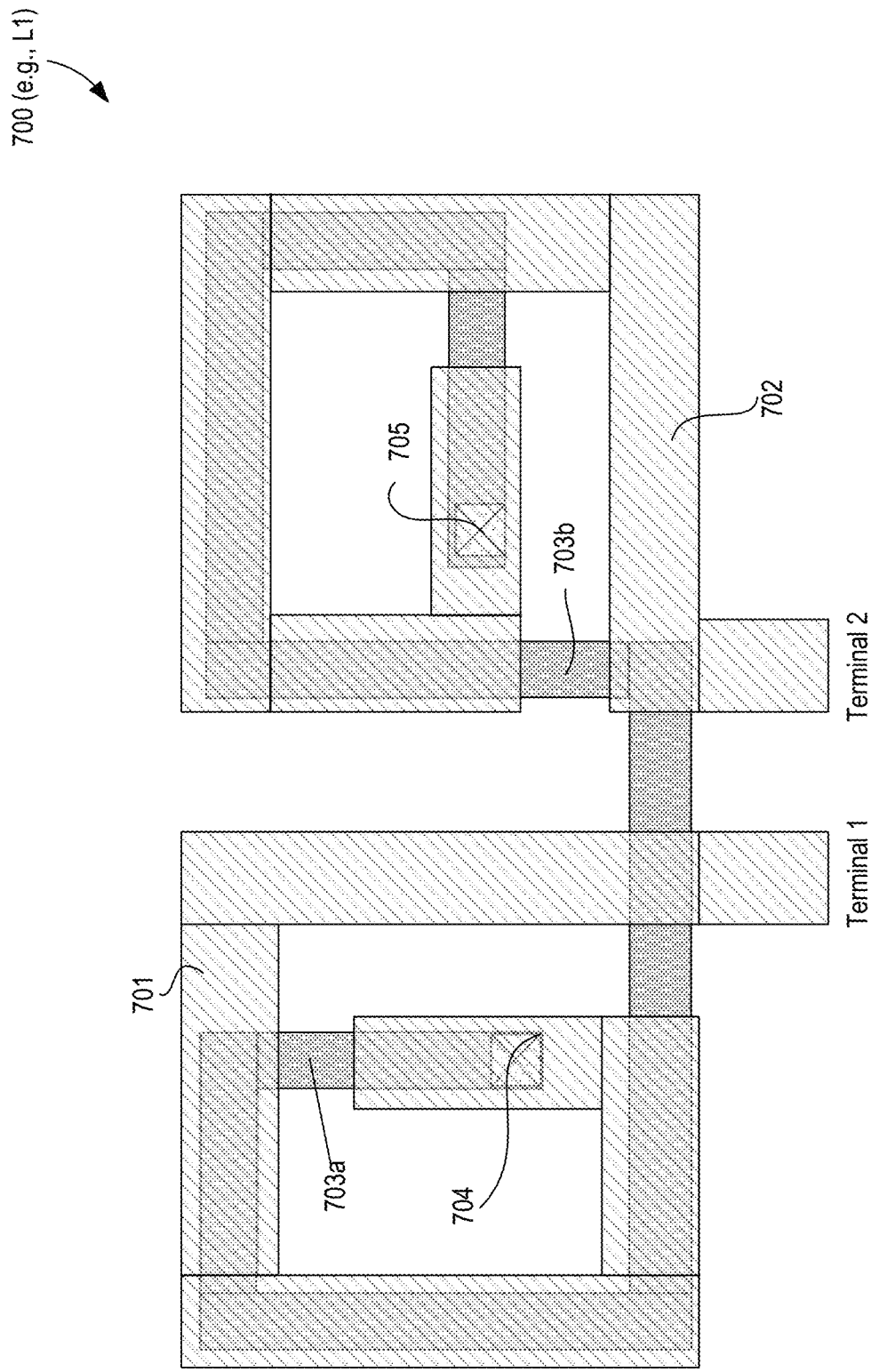
FIG. 7 illustrates a top view of a two-tier inductor with substantially 90 degree rotated independent coils, in accordance with some embodiments.

FIG. 7 illustrates a top view of a two-tier inductor 700 with substantially 90 degree rotated independent coils, in accordance with some embodiments. Compared to the two-tier inductor 600 of FIGS. 6A-B, here the coil 701 over coil 703*a* (together called the first coil set) are of different shapes. For example, coil 703*a* under coil 701 is smaller than coil 701. Coil 701 is coupled to coil 703*a* though via 704. In some embodiments, the pair of coils 701 and 703*a* when copied and rotated clockwise by 90 degrees (or substantially 90 degrees), form the second coil set comprising coil 702 and 703*b*. The two coils 702 and 703*b* are coupled together though via 705. While inductor 700 is a two-tier structure, more than two-tiers can be added over or below coils 701 and 702 and connected as shown. In some embodiments, the dual-coil two-tier structure 700 can be expanded to a quad-coil structure of FIGS. 4-5 with multiple tiers using the same concepts.

Figure 8:
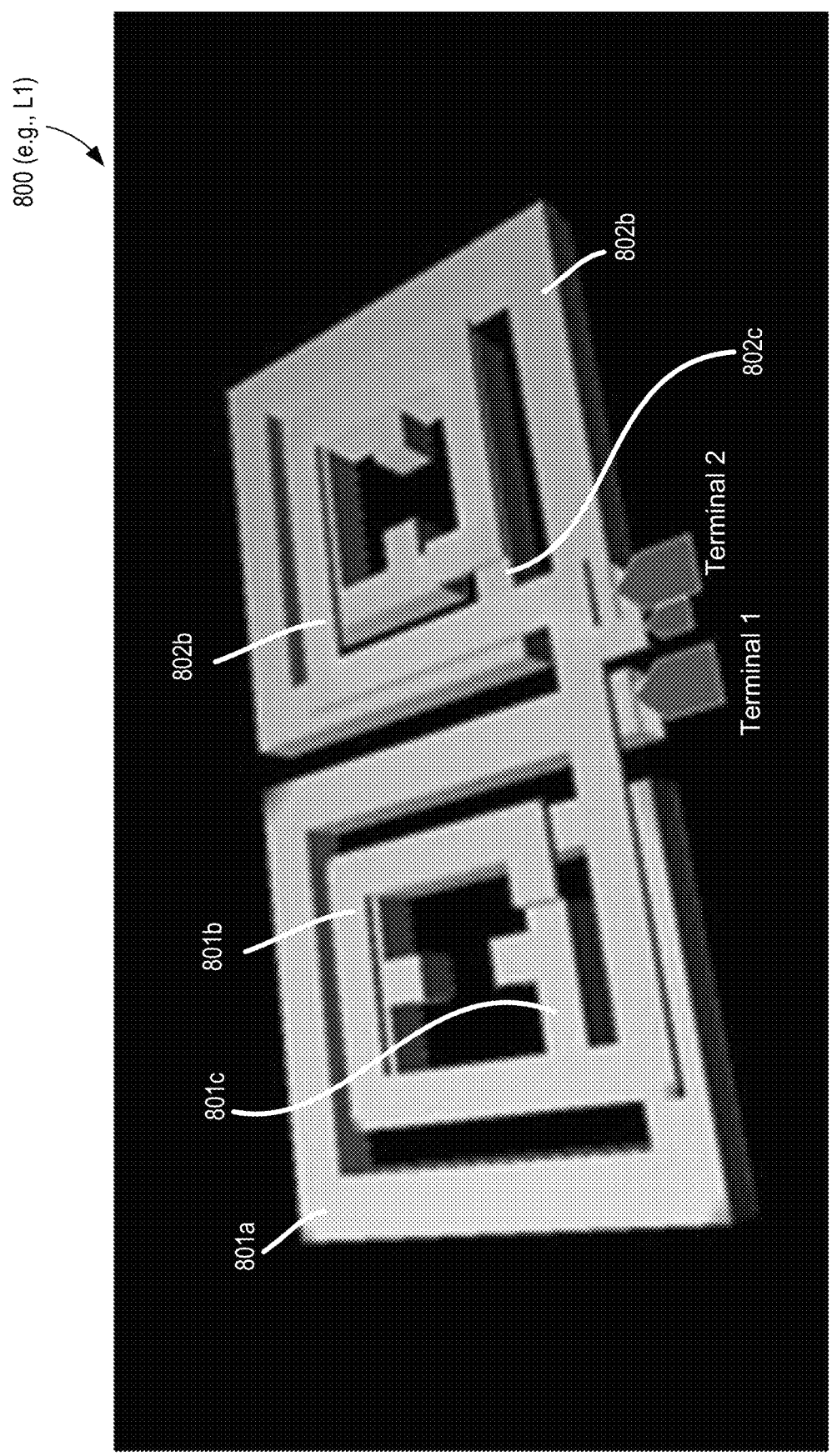
FIG. 8 illustrates a 3D view of a three-tier inductor with substantially 90 degree rotated independent coils, in accordance with some embodiments.

FIG. 8 illustrates a 3D view of a three-tier inductor 800 with substantially 90 degree rotated independent coils, in accordance with some embodiments. Compared to two-tier inductor 700, here each coil set has three tiers. The first coil set comprises coils 801*a*, 801*b*, and 801*c*. The second coil set comprises coils 802*a*, 802*b*, and 802*c*. The second coil set is formed by rotating a copy of the first coil set clockwise by 90 degrees or substantially 90 degrees. As shown, each coil of the tier is of a different shape, and each coil in the same tier is of the same shape but rotated by 90 degrees. In some embodiments, the dual-coil three-tier structure 800 can be expanded to a quad-coil structure of FIGS. 4-5 with multiple tiers using the same concepts.

Figure 9:
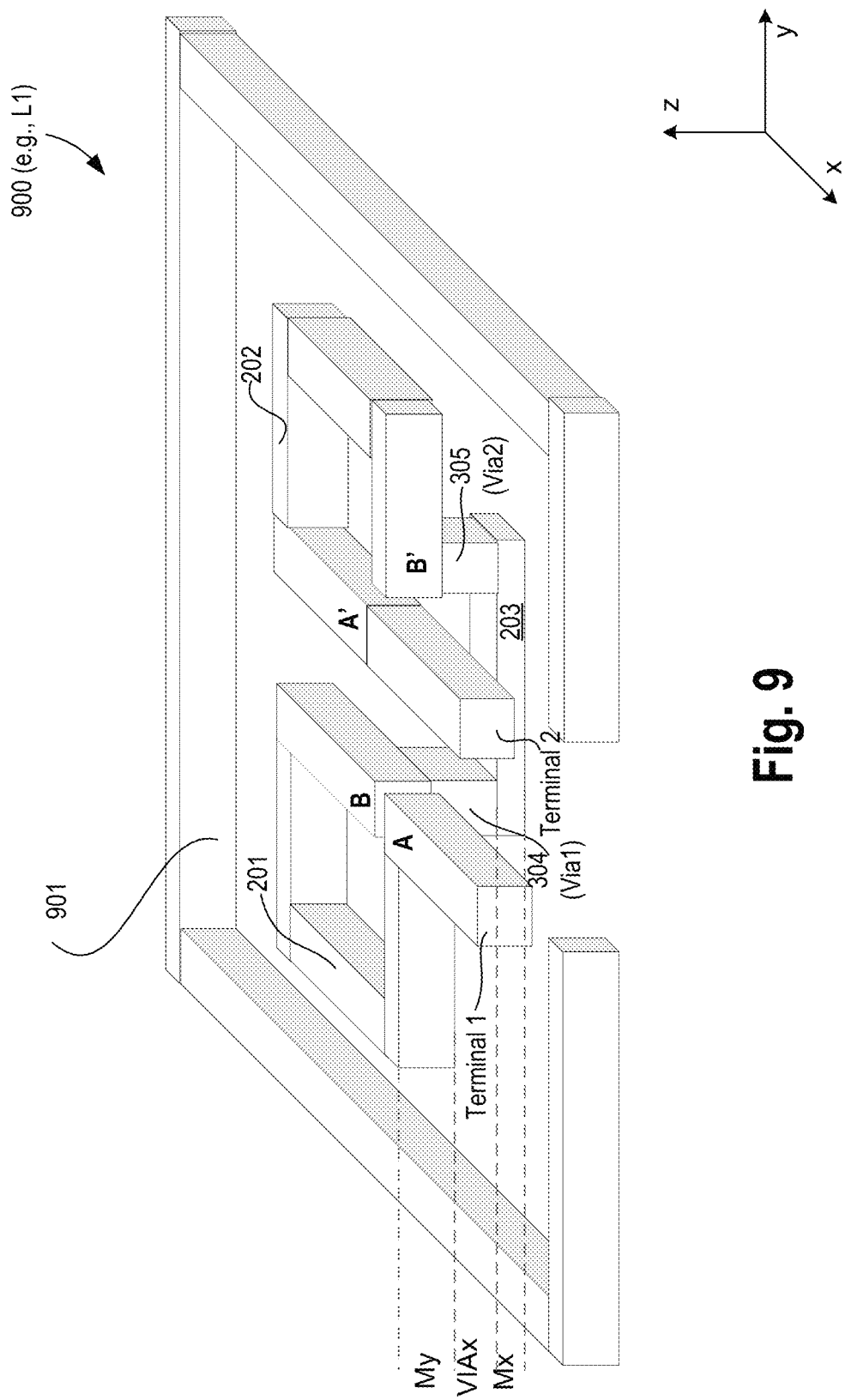
FIG. 9 illustrates a 3D view of the dual-coil inductor with substantially 90 degree rotated independent coils, and with guard-band, in accordance with some embodiments.

FIG. 9 illustrates a 3D view of the dual-coil inductor 900 with substantially 90 degree rotated independent coils, and with guard-band, in accordance with some embodiments. Compared to dual-coil inductor 300, here an additional guard band 901 is formed around the inductor coils to protect from magnetic disturbances outside the inductor. In some embodiments, guard band 901 can be on the same metal layer as layers for coils 201 and 202. In some embodiments, guard band 901 can extend through via region VIAx and/or to metal layers Mx and/or My to provide complete protection to the inductor from any interfering magnetic flux. Guard-band 901 can be formed around any one the inductors described with reference to various embodiments. The depth of guard-band 901 along the x-direction depends on factors such as area, magnitude and direction of interfering flux, etc.

Figure 10:
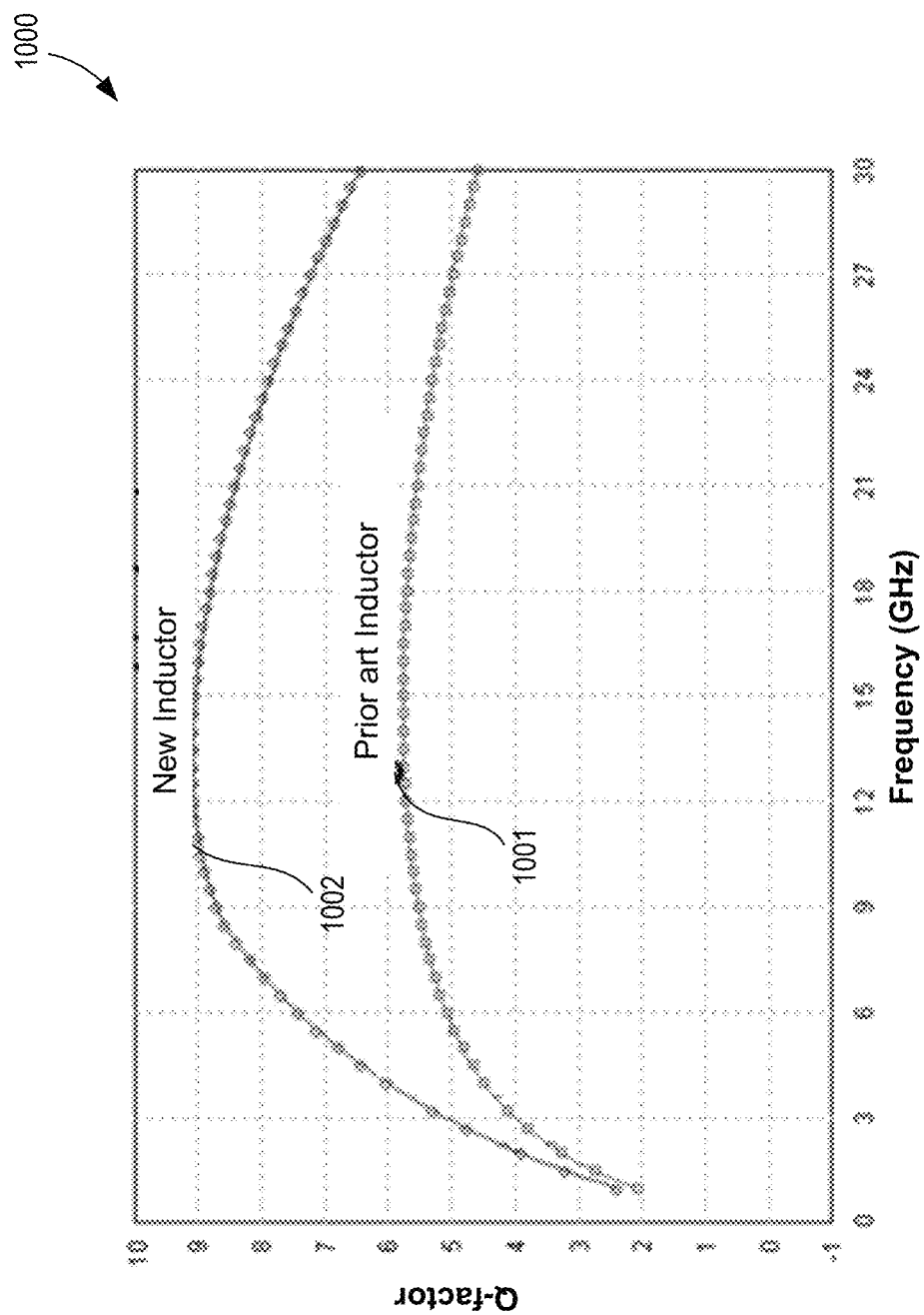
FIG. 10 illustrates a plot showing improvement in Q-factor using the inductor of various embodiments.

FIG. 10 illustrates a plot 1000 showing improvement in Q-factor using the inductor of various embodiments. Here, x-axis is frequency in GHz (giga-Hertz) and y-axis is quality factor (Q-factor). Plot 1000 shows data from two different inductor structures. Data forming waveform 1001 is from a traditional inductor such as an 8-shape inductor that has extra jogs in the metal forming the coils, and suffers from destructive magnetic flux. Data forming waveform 1002 is from the dual-coil inductor 300 in accordance with some embodiments. The Q-factor improves significantly with the inductor structure of various embodiments.

Besides the Q-factor, k-factor or mutual inductance between adjacent coils is a key parameter. A general concept exists in literature that an inductor can be designed to reduce the magnetic coupling through many techniques, such as an 8-shape. An 8-shape is one example of a magnetic field cancelling structure where the magnetic field of two coils (also known as a dual pole coil) at a point in space equidistant to the coils is reduced to zero in an ideal situation. Manufacturing tolerances and small mismatch due to differences in the surroundings prevent perfect cancellation in reality, however, the magnetic field cancelling or far field cancelling structures are inherently more robust to magnetic coupling and enable tighter spacing between adjacent coils, preventing extra dead space to be required between them which would increase the cost. A general feature of a magnetic field cancelling structure is that two "poles" or "coils" also have currents circulating in opposite direction, where one is clockwise and the other is counter-clockwise, in order to generate the magnetic flux in the opposite direction. An extension of the concept is to apply additional "poles" or "coils" to create the magnetic field cancelling structure beyond two "poles" or "coils" such as a "quad coil" or "quad pole" inductor. The inductor structure of various embodiments enables a magnetic cancelling field property for dual coil, quad coil and other embodiments that use the scheme of 90-degree rotation (or smaller rotation for more than 4 pole or 4 coil structure).

The 90-degree rotation for a dual or quad coil enables the ability to connect to an arbitrary size circuit in a way that minimizes the additional routing, while keeping the coils clustered together. An alternate approach is to do a full 180-degree rotation and place the circuit in the center between the two "poles" or "coils", however, this may prevent the ability to maintain the coils in a cluster. By clustering the coils together, it maintains lower coupling to adjacent coils since the coupling is a function of the distance between the two poles. For example, even for points in space that are not exactly equidistant between the two "poles" or "coils", there is a magnetic field cancellation that depends on how far apart the two "poles" or "coils" are.

Figure 11:
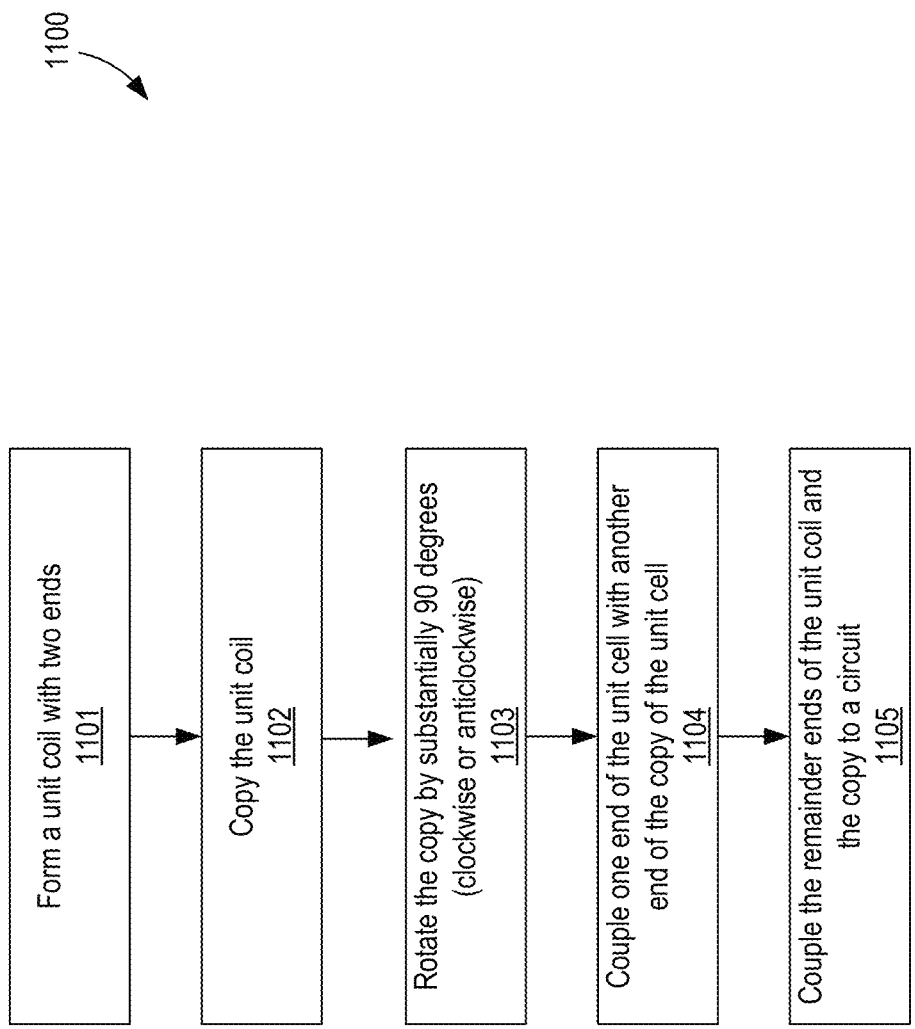
FIG. 11 illustrates a flowchart of a method of forming an inductor, in accordance with some embodiments of the disclosure.

FIG. 11 illustrates a flowchart 1100 of a method of forming an inductor, in accordance with some embodiments of the disclosure. Some operations of the flowchart can be performed before others, and some can be performed simultaneously. The order of the blocks in the flowchart is not required to form the inductor. At block 1101, a unit coil (e.g., coil 201) is formed. At block 1102, a copy (unit cell 202) of unit coil 201 is formed. At block 1103, the copy is rotated by 90 degrees or substantially 90 degrees in clockwise or anticlockwise direction. At block 1104, end B of coil 201 is coupled to end B' of coil 202. At block 1105, end A of coil 201 and end A' of coil 202 are coupled to a circuit (e.g., part of a LC-oscillator). The same process flow can be used for making other inductors of the various embodiments including the multi-tier inductors.

Figure 12:
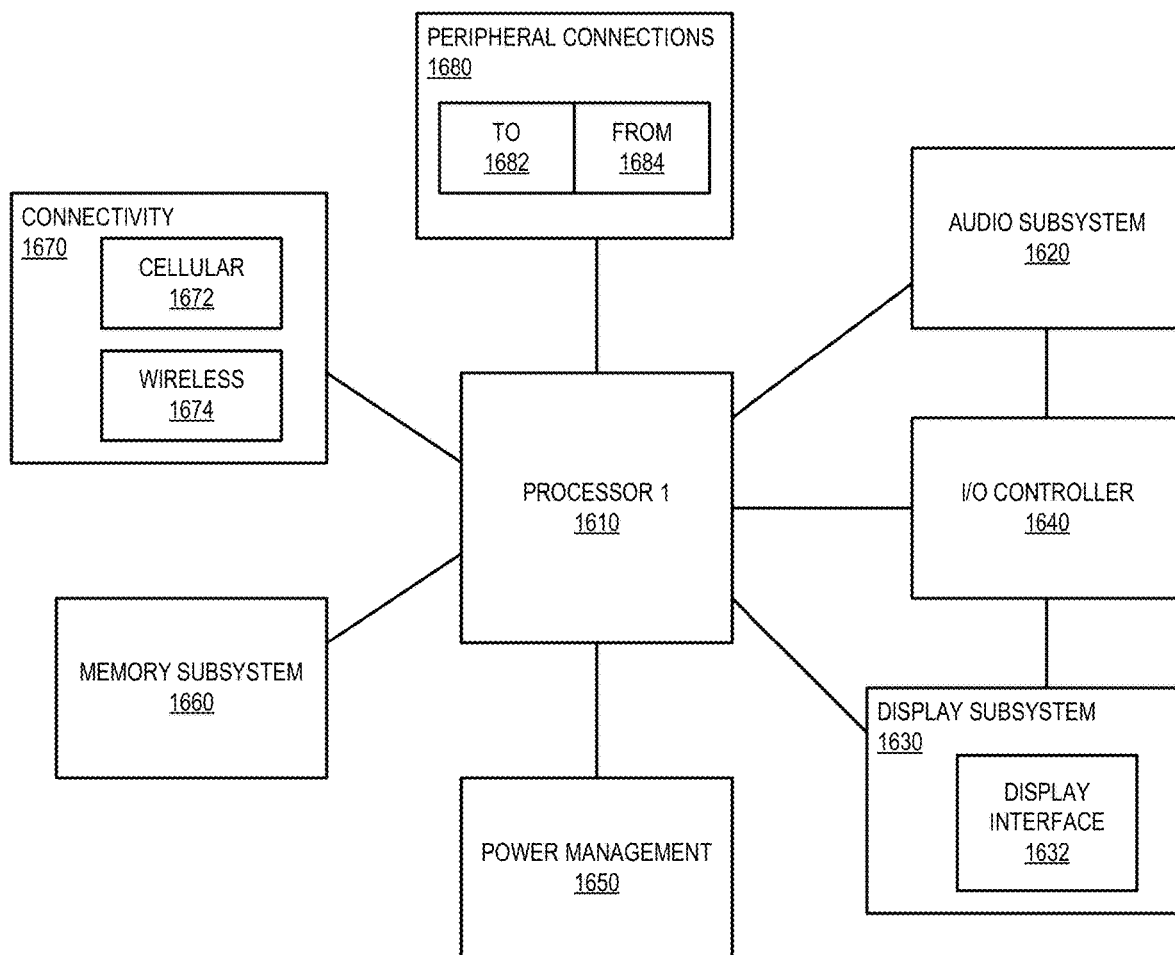
FIG. 12 illustrates a smart device, a computer system, or a SoC (System-on-Chip) with one or more inductors, according to some embodiments of the disclosure.

FIG. 12 illustrates a smart device, a computer system, or a SoC (System-on-Chip) with one or more inductors, according to some embodiments of the disclosure. FIG. 12 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes processor 1610 with one or more inductors, according to some embodiments discussed. Other blocks of the computing device 1600 may also include one or more inductors, according to some embodiments.

The various embodiments of the present disclosure may also comprise a network interface within 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An inductor comprises: a first coil having a first input and a second input; and a second coil having a first input and a second input, wherein: the second coil is rotated relative to the first coil by substantially 90 degrees; the first input of the first coil is coupled to the first input of the second coil; and the first and second coils are adjacent to one another along a same plane of a device.

Example 2

The inductor of claim 1, wherein the first input of the first coil is coupled to the first input of the second coil through a metal line which is on a layer different from a layer having the first and second coils.

Example 3

The inductor of claim 1 having a first terminal and a second terminal, wherein the second input of the first coil is the first terminal; and the second input of the second coil is the second terminal.

Example 4

The inductor of claim 1 comprising: a third coil under or above the first coil, wherein third coil has substantially the same shape as the first coil, and wherein the third coil is coupled to the first input of the first coil through a first via; and a fourth coil under or above the second coil, wherein fourth coil has substantially the same shape as the second coil, and wherein the fourth coil is coupled to the first input of the second coil through a second via.

Example 5

The inductor of claim 1 comprising a metal around the first and second coils such that the first and second coils are located inside the metal.

Example 6

An inductor comprising: a first coil having a first input and a second input; a second coil having a first input and a second input; a third coil having a first input and a second input; and a fourth coil having a first input and a second input, wherein: the third coil is rotated relative to the fourth coil by substantially 90 degrees; the third coil is rotated relative to the first coil by substantially 90 degrees; and the fourth coil is rotated relative to the second coil by substantially 90 degrees; and the first, second, third, and fourth coils are coupled to one another.

Example 7

The inductor of claim 6, wherein the first input of the first coil is coupled to the second input of the third coil.

Example 8

The inductor of claim 6, wherein the second input of the first coil is coupled to the first input of the second coil.

Example 9

The inductor of claim 6, wherein the second input of the second coil is coupled to the second input of the fourth coil.

Example 10

The inductor of claim 6, wherein the first input of the fourth coil is a first terminal of the inductor, and wherein the first input of the third coil is a second terminal of the inductor.

Example 11

The inductor of claim 6, wherein the first and second coils are adjacent to one another, wherein the first and third coils are adjacent to one another, wherein the second and fourth coils are adjacent to one another, wherein the second and fourth coils are adjacent to one another, and wherein the first, second, third, and fourth coils are along a same plane of a device.

Example 12

The inductor of claim 6, wherein the first input of the fourth coil is coupled to the first input of the second coil.

Example 13

The inductor of claim 6 comprising a first terminal and a second terminal, wherein the second input of the first coil is the first terminal; and the second input of the second coil is the second terminal.

Example 14

An apparatus comprising: a phase frequency detector to receive a reference clock and a feedback clock; a charge pump coupled to the phase frequency detector; a filter coupled to the charge pump; and an inductor-capacitor (LC) oscillator coupled to the filter, wherein the LC oscillator includes an inductor which comprises: a first coil having a first input and a second input; and a second coil having a first input and a second input, wherein: the second coil is rotated relative to the first coil by substantially 90 degrees; the first input of the first coil is coupled to the first input of the second coil; and the first and second coils are adjacent to one another along a same plane of a device.

Example 15

The apparatus of claim 14 comprising a divider coupled LC oscillator, wherein the divider is to generate the feedback clock.

Example 16

The apparatus of claim 14, wherein the LC oscillator includes a varactor, wherein the inductor is part of the varactor, wherein the varactor includes a capacitor with adjustable capacitance, and wherein the apparatus comprises a calibration circuitry to adjust the capacitance.

Example 17

The apparatus of claim 14, wherein the first input of the first coil is coupled to the first input of the second coil through a metal line which is on a layer different from a layer having the first and second coils.

Example 18

The apparatus of claim 14 having a first terminal and a second terminal, wherein the second input of the first coil is the first terminal; and the second input of the second coil is the second terminal.

Example 19

The apparatus of claim 14 comprising: a third coil under or above the first coil, wherein third coil has substantially the same shape as the first coil, and wherein the third coil is coupled to the first input of the first coil through a first via; and a fourth coil under or above the second coil, wherein fourth coil has substantially the same shape as the second coil, and wherein the fourth coil is coupled to the first input of the second coil through a second via.

Example 20

The apparatus of claim 14 comprising a metal around the first and second coils such that the first and second coils are located inside the metal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An inductor, comprising:
    a first coil having a first end and a second end;
    a second coil having a first end and a second end, wherein the second coil is rotated relative to the first coil by substantially 90 degrees, the first end of the first coil is coupled to the first end of the second coil, and the first and second coils are adjacent to one another along a same plane of a device;
    a third coil under the first coil, wherein the first and third coils are of different shapes, and wherein the third coil is coupled to the first coil through a first via; and
    a fourth coil under the second coil, wherein the second and fourth coils are of different shapes, and wherein the fourth coil is coupled to second coil through a second via.

2. The inductor of claim 1, wherein the first end of the first coil is coupled to the first end of the second coil through a metal line, which is on a layer different from a layer having the first and second coils.

3. The inductor of claim 1, wherein the inductor consists of two terminals, a first of the two terminals coupled to the first end of the first coil and a second of the two terminals coupled to the first end of the second coil.

4. The inductor of claim 1, wherein the third coil is smaller than the first coil and the fourth coil is smaller than the second coil.

5. The inductor of claim 1, further comprising a metal around the first and second coils.

6. An inductor comprising:
    a first coil having a first end and a second end;
    a second coil having a first end and a second end, wherein the second coil is rotated relative to the first coil by substantially 90 degrees;
    a third coil having a first end and a second end, wherein the third coil is rotated relative to the second coil by substantially 90 degrees; and
    a fourth coil having a first end and a second end, wherein the fourth coil is rotated relative to the third coil by substantially 90 degrees, wherein the inductor consists of two terminals, a first of the two terminals coupled to the first end of the first coil and a second of the two terminals coupled to the second end of the second coil.

7. The inductor of claim 6, wherein the first end of the first coil is orthogonal to the second end of the second coil.

8. The inductor of claim 7, wherein the first end of the second coil is coupled to the second end of the third coil, the first end of the second coil and the second end of the third coil being substantially aligned, and wherein the first end of the first coil is coupled to the first end of the fourth coil, the first end of the first coil and the first end of the fourth coil being substantially orthogonal.

9. The inductor of claim 8, wherein the first end of the third coil is coupled to the second end of the fourth coil, the first end of the third coil and the second end of the fourth coil being substantially aligned.

10. The inductor of claim 8, wherein the first, second, third, and fourth coils and the first and second terminals are at a first metal layer and interconnects between the first terminal and the first end of the first coil and between the second terminal and the second end of the second coil are at a second metal layer.

11. The inductor of claim 6, wherein the first and second terminals are substantially equal-distant from first and second transistors.

12. The inductor of claim 6, wherein the first and second terminals extend between the third and fourth coils, and wherein the first end of the first coil and the second end of the second coil are substantially aligned.

13. The inductor of claim 12, wherein the second end of the first coil is coupled to the second end of the fourth coil, the second end of the first coil and the second end of the fourth coil being substantially orthogonal, and wherein the first end of the second coil is coupled to the second end of the third coil, the first end of the second coil and the second end of the third coil being substantially aligned.

14. The inductor of claim 13, wherein the first end of the fourth coil is coupled to the second end of the third coil, the first end of the fourth coil and the second end of the third coil being substantially orthogonal.

15. The inductor of claim 13, wherein the first, second, third, and fourth coils and the first and second terminals are at a first metal layer and interconnects between the first terminal and the first end of the first coil and between the second terminal and the second end of the second coil are at a second metal layer.

16. An apparatus, comprising:
a phase frequency detector to receive a reference clock and a feedback clock;
a charge pump coupled to the phase frequency detector;
a filter coupled to the charge pump; and
an inductor-capacitor (LC) oscillator coupled to the filter, wherein the LC oscillator comprises an
inductor comprising:
a first coil having a first end and a second end;
a second coil having a first end and a second end, wherein the second coil is rotated relative to the first coil by substantially 90 degrees;
a third coil having a first end and a second end, wherein the third coil is rotated relative to the second coil by substantially 90 degrees; and
a fourth coil having a first end and a second end, wherein the fourth coil is rotated relative to the third coil by substantially 90 degrees, wherein the inductor consists of two terminals, a first of the two terminals coupled to the first end of the first coil and a second of the two terminals coupled to the second end of the second coil.

17. The apparatus of claim 16, wherein the LC oscillator comprises a varactor, wherein the inductor is part of the varactor, wherein the varactor comprises a capacitor with adjustable capacitance, and wherein the apparatus comprises calibration circuitry to adjust the capacitance.

18. The apparatus of claim 16, wherein the first end of the first coil is orthogonal to the second end of the second coil, wherein the first end of the second coil is coupled to the second end of third coil, the first end of the second coil and the second end of the third coil being substantially aligned, and wherein the first end of the first coil is coupled to the first end of the fourth coil, the first end of the first coil and the first end of the fourth coil being substantially orthogonal.

19. The apparatus of claim 16, wherein the first and second terminals are substantially equal-distant from first and second transistors of the LC oscillator.

20. The apparatus of claim 16, wherein the first and second terminals extend between the third and fourth coils, and wherein the first end of the first coil and the second end of the second coil are substantially aligned, wherein the second end of the first coil is coupled to the second end of the fourth coil, the second end of the first coil the second end of the fourth coil being substantially orthogonal, and wherein the first end of the second coil is coupled to the second end of the third coil, the first end of the second coil and the second end of the third coil being substantially aligned.

* * * * *